United States Patent [19]

Stefani et al.

[11] Patent Number: 4,612,452

[45] Date of Patent: Sep. 16, 1986

[54] CONTROL CIRCUIT FOR THE SWITCHING OF INDUCTIVE LOADS HAVING A PUSH-PULL OUTPUT STAGE

[75] Inventors: Fabrizio Stefani, Cardano al Campo; Carlo Cini, Cornaredo; Angelo Alzati, Bollate, all of Italy

[73] Assignee: SGS-ATES Componenti Elettronici SpA, Agrate Brianza, Italy

[21] Appl. No.: 476,374

[22] Filed: Mar. 17, 1983

[30] Foreign Application Priority Data

Mar. 17, 1982 [IT] Italy .............................. 20213 A/82

[51] Int. Cl.⁴ ...................... H03K 3/33; H03K 17/60
[52] U.S. Cl. .................................... 307/300; 307/280; 307/246; 307/270; 307/596; 307/254
[58] Field of Search ............... 307/270, 255, 254, 246, 307/253, 596, 313, 239–241, 280, 300

[56] References Cited

U.S. PATENT DOCUMENTS 3,828,208  8/1974  Kelleher .

4,095,128  6/1978  Tanigaki ............................. 307/254

Primary Examiner—Stanley D. Miller
Assistant Examiner—R. Roseen
Attorney, Agent, or Firm—Wenderoth, Lind & Ponack

[57] ABSTRACT

A control circuit for the switching of inductive loads which is monolithically integratable and includes an output stage having push-pull transistors. The base of each transistor of the output stage is connected to a driver circuit and to an auxiliary transistor which is biased in saturation. Each auxiliary transistor is driven to conduction in phase opposition with respect to the final transistor to which it is connected. The auxiliary transistor accelerates the turn-off of the final transistor, withdrawing the base charge, while delaying the turn-on thereof and absorbing the current fed thereto for a period of time equal to that of its own turn-off transient; in this way, the simultaneous conduction of the transistors of the final stage during the switching thereof can be avoided.

7 Claims, 2 Drawing Figures

U.S. Patent   Sep. 16, 1986   4,612,452
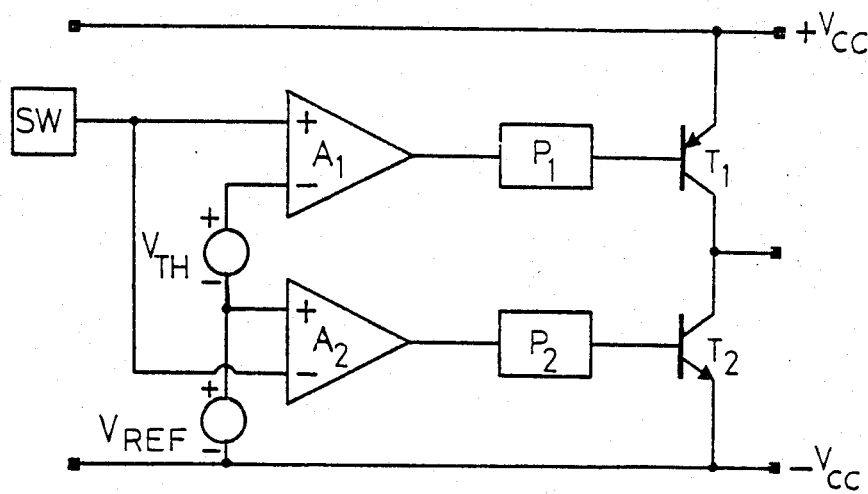
FIG. 1                   PRIOR ART
FIG. 2
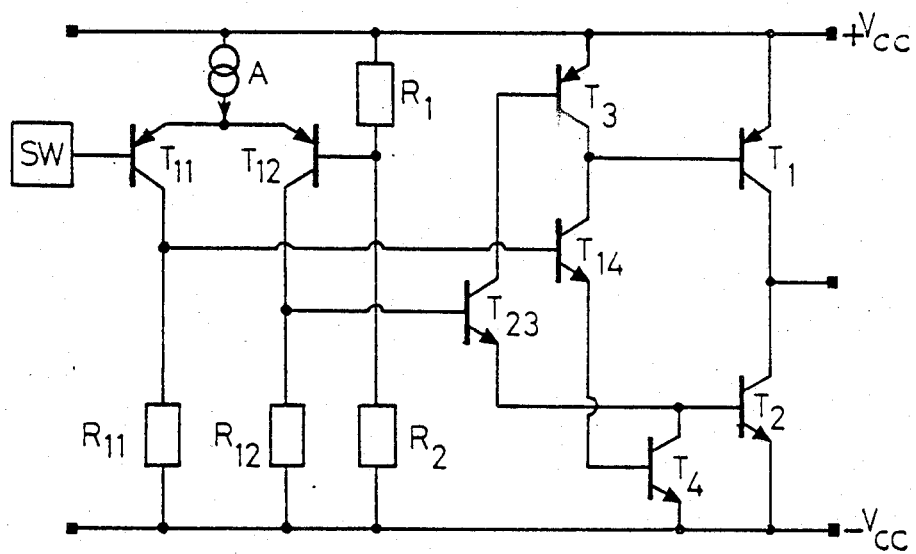

CONTROL CIRCUIT FOR THE SWITCHING OF INDUCTIVE LOADS HAVING A PUSH-PULL OUTPUT STAGE

BACKGROUND OF THE INVENTION

The present invention relates to a control circuit for the switching of inductive loads, more particularly to a control circuit that can be integrated monolithically and which comprises a final class-B stage with push-pull transistors and which is usable for driving relays, solenoids, and DC motors. The simplest type of final class-B stage with push-pull transistors is composed of a pair of complementary transistors connected in cascade with the emitter terminals connected between the two poles of a D.C. supply voltage generator and the collector terminals connected together. The load is connected to the connection between the two transistors (i.e.-the collector terminals) which thus constitutes the output terminal of the stage. By means of their base terminals, the two transistors are alternately driven into conduction in phase opposition, providing current flow in opposite directions to the load.

However, the switching of such transistors does not occur instantaneously, but with a transient having a time duration which is not negligible, especially when the transistors conduct so as to be in saturation. Therefore, when they are simply controlled in phase opposition, during the switching of the final stage, they cannot be prevented from being turned-on simultaneously.

The simultaneous conduction of the two transistors generally causes an undesirable increase in the power dissipation in the final stage.

When the load connected to the final stage is of an inductive type, the back electromotive force induced by the variation of the current flowing therethrough, due to the switching of the final stage, suddenly increases the collector-emitter voltage of the transistor during the transition period when the transistor is being turned off but is still in conduction, thus causing in said transistor its maximum value of its power dissipation, sometimes with destructive effects.

Therefore, it is necessary to prevent the transistors of a final push-pull stage, including those used in a control circuit for the switching of inductive loads, from becoming simultaneously conductive during switching.

As is well known, the simplest way to resolve this problem is to provide a control circuit with a final push-pull stage, wherein the control for the turning on of the final turned-off transistor is appropriately delayed with respect to the control for turning off the conductive transistor.

FIG. 1 is a circuit diagram, partially in blocks, of this type of known control circuit which can be integrated monolithically. It comprises two bipolar transistors $T_1$ and $T_2$, of the PNP and NPN type respectively, connected in push-pull between the two poles $+V_{CC}$ and $-V_{CC}$, of a DC supply voltage generator to which their emitters are connected, while their collectors are connected together so as to form the output terminal of the circuit.

The bases of $T_1$ and $T_2$ are each connected by means of a suitable biasing circuit, indicated in the FIG. 1 by the blocks $P_1$ and $P_2$, to the output of two comparators $A_1$ and $A_2$. The inverting input of $A_2$ and the non-inverting input of $A_1$ are connected together, constituting the input of the circuit to which is connected a switching-signal source denoted in the figure by the block SW. The inverting input of $A_1$ is connected to the non-inverting input of $A_2$ by means of a first constant-voltage generator $V_{TH}$ which is positive with respect to the potential of the non-inverting input of $A_2$; the non-inverting input of $A_2$ is connected to $-V_{CC}$ by means of a second constant-voltage generator $V_{REF}$, which is positive with respect to the potential of $-V_{CC}$.

With respect to $-V_{CC}$, the input signal has a minimum level which is lower than $V_{REF}$ and a maximum level which is higher than $V_{REF}+V_{TH}$; the transition of the input voltage from a value less than $V_{REF}$ to a value greater than $V_{REF}+V_{RG}$, or vice versa, determines the switching of the final stage.

When the signal level is lower than $V_{REF}$, $T_1$ is turned off and $T_2$ is turned on. When the signal level is higher than $V_{REF}+V_{TH}$, $T_1$ is turned on and $T_2$ is turned off.

For signal values ranging from $V_{REF}$ to $V_{REF}+V_{TH}$, both transistors of the final stage are turned off. Therefore, by properly choosing the value $V_{TH}$ in accordance with variations in the switching signal time, one can rule out the simultaneous conduction of $T_1$ and $T_2$ or, if it is more convenient, limit the duration thereof so as to eliminate all destructive effects.

A monolithically integratable control circuit of the type under consideration effectively resolves the problem of any simultaneous conduction of the final transistors in a control circuit for switching with a final stage having push-pull output transistors, but uses for this purpose circuit means that are relatively complex, such as the two comparators, and are therefore costly in terms of integration space.

SUMMARY OF THE INVENTION

The object of the present invention is to provide a control circuit for the switching of inductive loads that can be integrated monolithically and comprises a final class B stage using push-pull transistors and which is industrially more economical than circuits of known construction.

This object is achieved by means of the control circuit for the switching of inductive loads as defined and characterized in the claims following the present description.

BRIEF DESCRIPTION OF THE DRAWINGS

Other features and advantages of the invention will be better understood from the consideration of the ensuing description offered by way of non-limitative example and from the attached drawings, wherein:

FIG. 1 is a circuit diagram, partly in blocks, of the control circuit of known construction for the switching of inductive loads, as described above;

FIG. 2 is a circuit diagram of a control circuit for the switching of inductive loads with a final push-pull stage in accordance with the invention.

In the drawing figures, like signs denote like parts.

DESCRIPTION OF THE PREFERRED EMBODIMENTS

The diagram of a control circuit embodying the invention shown in FIG. 2 comprises a final stage with two bipolar transistors T1 and T2, respectively of the PNP and NPN type, whose collectors are connected together so as to form the output terminals of the circuit.

It is noted that field effect transistors may be utilized instead of bipolar transistors. Since the operation of field effect transistors is analogous to that of bipolar transistors, the circuit diagram and descriptions for only the bipolar transistor case are contained herein for the purpose of brevity.

The emitter of $T_1$ and that of $T_2$ are respectively connected to the first pole ($+V_{CC}$) and to the second pole ($-V_{CC}$) of a D.C. supply voltage generator.

The collector of a PNP transistor $T_3$ is connected to the base of $T_1$. The collector of an NPN bipolar transistor $T_4$ is connected to the base of $T_2$.

The emitter of $T_3$ is connected to $+V_{CC}$ and the emitter of $T_4$ is connected to $-V_{CC}$. The base of $T_1$ and that of $T_4$ are respectively connected, to the collector and to the emitter of a bipolar NPN transistor $T_{14}$. The base of $T_3$ and the base of $T_2$ are respectively connected to the collector and to the emitter of a bipolar NPN transistor $T_{23}$. The control circuit also has a differential structure formed of two PNP transistors $T_{11}$ and $T_{12}$, whose emitters are connected to $+V_{CC}$ by means of a constant-current generator A.

By contrast, the collector of $T_{11}$ and the collector of $T_{12}$ are respectively connected to $-V_{CC}$ through a resistor $R_{11}$ and a resistor $R_{12}$.

The base of $T_{14}$ and the base of $T_{23}$ are respectively connected to the collector of $T_{11}$ and to the collector of $T_{12}$.

The base of $T_{12}$ is connected to $+V_{CC}$ through a resistor $R_1$, and to $-V_{CC}$ through a resistor $R_2$.

The base of $T_{11}$ is connected to a switching-signal source represented in FIG. 2 by the block SW.

The following is an examination of the operation of the circuit illustrated in FIG. 2. The parameters of the differential structure comprising the transistors $T_{11}$ and $T_{12}$ are calculated such that the switching signals which are generated by SW and are applied to the base of $T_{11}$ alternately determine the conduction of transistors $T_{11}$ and $T_{12}$.

Consequently, transistors $T_{14}$ and $T_{23}$ are also alternately in conduction which thus, in dependance upon the input signals, alternately drive the transistors $T_1$ and $T_2$ of the final stage and the transistors $T_3$ and $T_4$ connected thereto.

The transistors $T_3$ and $T_4$ conduct to saturation. The transistors $T_{14}$ and $T_{23}$, on the other hand, conduct in the active region, or in the saturation region at the boundary of the active region, so that the duration of their switching transition is negligible.

Let is be assumed that $T_{14}$ is conductive and that $T_{23}$ is non-conductive; $T_1$ and $T_4$ then conduct to saturation and $T_2$ and $T_3$ are turned off.

When the switching signal generated by SW alternatively switches $T_{14}$ and $T_{23}$ via the differential circuit consisting of $T_{11}$, $T_{12}$, A, $R_1$, $R_2$, $R_{11}$, and $R_{12}$, then $T_1$, $T_4$, $T_3$ and $T_2$ are also correspondingly alternately switched.

The transistor $T_3$ starts—with a negligible delay—to conduct to saturation; $T_3$ withdraws the charge from the base of $T_1$, thereby reducing the duration of the switching transient of $T_1$ from saturation to cut-off.

The transistor $T_4$, on the other hand, continues to conduct, first to saturation and then to quasi-saturation until its base is deprived of the charge stored therein. During this transient, $T_4$ continues to absorb the emitter current of $T_{23}$, thus preventing $T_2$ from being turned on, Therefore, transistor $T_2$ switches with a specified delay from the saturation conditions of $T_4$. The transistors $T_3$ and $T_4$, accelerate the turn-off of $T_1$ and delay the turn on of $T_2$, thereby preventing the simultaneous conduction of $T_1$ and $T_2$ or limiting its duration in such a way that it does not constitute a danger to the integrity of the device.

Similar and symmetrical is the operation of the circuit in the opposite case of switching; that is, $T_4$ accelerates the non-conduction of $T_2$, while $T_3$ delays the turn on of $T_1$, thus avoiding the dangerous effects of simultaneous conduction.

The transistors $T_3$ and $T_4$ do not imply an increase in the absorption of current in the circuit. In fact, the base current flowing from the base of the final transistor $T_1$, flows through the transistor $T_4$. The base current of $T_2$ flows through $T_{23}$, to the base of $T_3$. Furthermore, the collector current of $T_3$ and $T_4$ is limited to the current for the withdrawal of the charges from the bases of $T_1$ and $T_2$ during the turn-off transient.

A control circuit for the switching of inductive loads in accordance with the invention is particularly adapted to being integrated in a monolithic semiconductor block, with the integration techniques as is known from the prior art. The transistors $T_3$ and $T_4$ which are the circuit elements characteristic of the invention, are normally bipolar transistors whose integration, both in terms of manufacturing difficulty and in terms of space requirements, turn out to be inexpensive on an industrial scale.

Therefore, the economic advantage of a control circuit according to the present invention over that of the prior art is obvious.

While the present invention is illustrated in conjunction with a particular embodiment of the invention, it is readily apparent that numerous variations are possible without departing from the scope of the invention.

For example, the transistors of the final stage can be replaced by equivalent circuit elements that have more transistors, as are known to those skilled in the art.

The differential structure with $T_{11}$ and $T_{12}$, too, can be replaced by more complex switching structures.

The output stage transistors can be driven to alternately switched states with a current mirror instead of single transistors $T_{14}$ and $T_{23}$.

We claim:

1. A monolithically integratable control circuit for switching inductive loads and having a push-pull output stage, said circuit comprising:

first and second active circuit means, each having a first terminal, a second terminal and a control terminal, and each of said first and second active circuit means having at least a first state in which said means is conductive and a second state in which said means is non-conductive, each of said active circuit means being operatively connected between first and second terminals of a supply voltage generator, and said control terminals of said active circuit means being connected to a supply source by means of a control circuit means which is connected to a switching signal source, said control circuit means alternately rendering said first and second active circuit means conductive in response to said switching signal source;

wherein said circuit means comprises a third and a fourth active circuit means for the withdrawal of charges, each of said third and fourth active circuit means having at least a first state in which said means is conductive and a second state in which said means is non-conductive, said third and fourth active circuit means being respectively connected to said control terminals of said first and second active circuit means and being operatively connected to said control circuit means which controls said third and fourth active circuit means for the withdrawal of corresponding charges from said second and first active circuit means, and wherein said third active circuit means is rendered conductive by said control circuit means for a specified period of time having a duration which is equal to or greater than a duration of a period of time during which said second active circuit means is rendered conductive by said control circuit means, and wherein said fourth active circuit means is rendered conductive by said control circuit means for a specified period of time having a duration which is equal to or greater than a duration of a period of time during which said first active circuit means is rendered conductive by said control circuit means;

wherein said first terminal of said first active circuit means is connected to said first terminal of said supply voltage generator and said first terminal of said second active circuit means is connected to said second terminal of said supply voltage generator and wherein said second terminals of both of said first and second active circuit means are connected together so as to constitute an output terminal of said control circuit, and wherein said third and fourth active circuit means respectively comprise first and second transistors, each transistor having a first terminal, a second terminal, and a control terminal and wherein first and second terminals of said first transistor are respectively connected to said first terminal of said supply voltage generator and to said control terminal of said first active circuit means, and said first and second terminals of said second transistor are respectively connected to said second terminal of said supply voltage generator and to said control terminal of said second active circuit means, and wherein said control terminals of said first and second transistors are connected to said control circuit means and wherein said first and second transistors conduct to saturation.

2. A control circuit according to claim 1, wherein said control circuit means comprises a third transistor and a fourth transistor, each of said third and fourth transistors having collectors connected to said second terminal of said supply voltage generator through resistors, and a base of said third transistor being connected to said switching signal source, a base of said fourth transistor being connected to said first and second terminals of said supply voltage generator through resistors, and further comprising a fifth and a sixth transistor having bases which are respectively connected to a collector of said third and said fourth transistor, a collector and emitter of said fifth transistor being respectively connected to said control terminal of said first active circuit means and said control terminal of said second transistor, an emitter and collector of said sixth transistor being respectively connected to said control terminal of said second active circuit means and said terminal of said first transistor, and wherein said supply souce comprises a constant current generator, by means of which emitters of said third and fourth transistors are connected to said first terminal of said supply voltage generator.

3. A monolithicaly integratable control circuit for switching inductive loads and having a push-pull output stage, said circuit comprising:

first and second active circuit means each having a first terminal, a second terminal and a control terminal, and each of said first and second active circuit means having at least a first state in which said means is conductive and a second state in which said means is non-conductive, each of said active circuit means being operatively connected between first and second terminals of a supply voltage generator, and said control terminals of said active circuit means being connected to a supply source by means of a control circuit means which is connected to a switching signal source, said control circuit means alternately rendering said first and second active circuit means conductive in response to said switching signal source;

wherein said circuit means comprises a third and a fourth active circuit means for the withdrawal of charges, each of said third and fourth active circuit means having at least a first state in which said means is conductive and a second state in which said means is non-conductive, said third and fourth active circuit means being respectively connected to said control terminals of said first and second active circuit means and being operatively connected to said control circuit means which controls said third and fourth active circuit means for the withdrawal of corresponding charges from said second and first active circuit means, and wherein said third active circuit means is rendered conductive by said control circuit means for a specified period of time having a duration which is equal to or greater than a duration of a period of time during which said second active circuit means is rendered conductive by said control circuit means, and wherein said fourth active circuit means is rendered conductive by said control circuit means for a specified period of time having a duration which is equal to or greater than a duration of a period of time during which said first active circuit means is rendered conductive by said control circuit means;

wherein said first and second active circuit means comprise transistors.

4. A control circuit according to claim 3, wherein said first and second and third and fourth active circuit means comprise bipolar transistors and wherein said first terminal, control terminal, and second terminal of said active circuit means respectively comprise an emitter, a base, and a collector.

5. A control circuit according to claim 3, wherein said first and second and third and fourth active circuit means comprise field-effect transistors and wherein said first terminal, control terminal, and second terminal of said active circuit means respectively comprise a source, a gate, and a drain.

6. A monolithically integratable control circuit for switching inductive loads and having a push-pull output stage, said circuit comprising:

first and second active circuit means, each having a first terminal, a second terminal and a control terminal, and each of said first and second active circuit means having at least a first state in which said means is conductive and a second state in which said means is non-conductive, each of said active circuit means being operatively connected between first and second terminals of a supply voltage generator, and said control terminals of said active circuit means being connected to a supply source by means of a control circuit means which is connected to a switching signal source, said control circuit means alternately rendering said first and second active circuit means conductive in response to said switching signal source;

wherein said circuit means comprises a third and a fourth active circuit means for the withdrawal of charges, each of said third and fourth active circuit means having at least a first state in which said means is conductive and a second state in which said means is non-conductive, said third and fourth active circuit means being respectively connected to said control terminals of said first and second active circuit means and being operatively connected to said control circuit means which controls said third and fourth active circuit means for the withdrawal of corresponding charges from said second and first active circuit means, and wherein said third active circuit means is rendered conductive by said control circuit means for a specified period of time having a duration which is equal to or greater than a duration of a period of time during which said second active circuit means is rendered conductive by said control circuit means, and wherein said fourth active circuit means is rendered conductive by said control circuit means for a specified period of time having a duration which is equal to or greater than a duration of a period of time during which said first active circuit means is rendered conductive by said control circuit means;

wherein said first active circuit means comprises a bipolar PNP transistor whose base is said control terminal of said means, an emitter and a collector of said transistor being respectively connected to a collector and a base of another bipolar NPN transistor which also comprises said first active circuit means, said collector and an emitter thereof respectively being said first and second terminal of said means, and wherein said second active circuit means comprises a bipolar NPN transistor whose base is said control circuit of said means, an emitter and a collector of said transistor being respectively connected to a base and a collector of another NPN bipolar transistor which also comprises said second active circuit means, said emitter and collector thereof respectively being said first and second terminals of said means.

7. A monolithically integratable control circuit for switching inductive loads and having a push-pull output stage, said circuit comprising:

first and second active circuit means, each having a first terminal, a second terminal and a control terminal, and each of said first and second active circuit means having at least a first state in which said means is conductive and a second state in which said means is non-conductive, each of said active circuit means being operatively connected between first and second terminals of a supply voltage generator, and said control terminals of said active circuit means being connected to a supply source by means of a control circuit means which is connected to a switching signal source, said control circuit means alternately rendering said first and second active circuit means conductive in response to said switching signal source;

wherein said circuit means comprises a third and a fourth active circuit means for the withdrawal of charges, each of said third and fourth active circuit means having at least a first state in which said means is conductive and a second state in which said means is non-conductive, said third and fourth active circuit means being respectively connected to said control terminals of said first and second active circuit means and being operatively connected to said control circuit means which controls said third and fourth active circuit means for the withdrawal of corresponding charges from said second and first active circuit means, and wherein said third active circuit means is rendered conductive by said control circuit means for a specified period of time having a duration which is equal to or greater than a duration of a period of time during which said second active circuit means is rendered conductive by said control circuit means, and wherein said fourth active circuit means is rendered conductive by said control circuit means for a specified period of time having a duration which is equal to or greater than a duration of a period of time during which said first active circuit means is rendered conductive by said control circuit means;

wherein a duration of a turn-off transient of said first and second transistors is greater than or equal to a duration of a turn-off transient of said first and second active circuit means.

* * * * *